United States Patent
Hirata

(10) Patent No.: US 10,872,757 B2
(45) Date of Patent: Dec. 22, 2020

(54) SEMICONDUCTOR SUBSTRATE PROCESSING METHOD

(71) Applicant: DISCO CORPORATION, Tokyo (JP)

(72) Inventor: Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/535,389

(22) Filed: Aug. 8, 2019

(65) Prior Publication Data

US 2020/0058483 A1 Feb. 20, 2020

(30) Foreign Application Priority Data

Aug. 14, 2018 (JP) ................................. 2018-152567

(51) Int. Cl.
*H01L 21/02* (2006.01)
(52) U.S. Cl.
CPC ............................. *H01L 21/02008* (2013.01)
(58) Field of Classification Search
CPC combination set(s) only.
See application file for complete search history.

(56) References Cited

U.S. PATENT DOCUMENTS

| 2006/0209045 | A1* | 9/2006 | Su | G06F 3/045 345/173 |
| 2014/0111408 | A1* | 4/2014 | Lau | G09G 3/3241 345/83 |
| 2017/0136572 | A1* | 5/2017 | Hirata | B23K 26/0876 |
| 2018/0371642 | A1* | 12/2018 | Adachi | C30B 29/26 |

FOREIGN PATENT DOCUMENTS

JP 2007503726 A 12/2004

* cited by examiner

*Primary Examiner* — Ratisha Mehta
(74) *Attorney, Agent, or Firm* — Greer Burns & Crain Ltd.

(57) ABSTRACT

A semiconductor substrate processing method includes: a peeling layer forming step of forming a peeling layer by irradiating a first semiconductor substrate with a laser beam having a wavelength capable of passing through the first semiconductor substrate while positioning a focal point of the laser beam within the first semiconductor substrate; a second semiconductor substrate forming step of forming a second semiconductor substrate by epitaxial growth on an upper surface of the first semiconductor substrate after performing the peeling layer forming step; a peeling step of peeling off the first semiconductor substrate from the peeling layer; and a grinding step of grinding and removing the first semiconductor substrate after performing the peeling step.

10 Claims, 3 Drawing Sheets

SEMICONDUCTOR SUBSTRATE PROCESSING METHOD

BACKGROUND OF THE INVENTION

Field of the Invention

The present invention relates to a semiconductor substrate processing method capable of efficiently removing a first semiconductor substrate from a two-layer structure semiconductor substrate in which a second semiconductor substrate is epitaxially grown on an upper surface of the first semiconductor substrate.

Description of the Related Art

A plurality of devices such as integrated circuits (ICs), large-scale integrated circuits (LSIs), power devices, or the like are formed on the top surface of a semiconductor substrate such as silicon (Si), silicon carbide (SiC), or the like, the top surface being demarcated by a plurality of intersecting planned dividing lines, and are divided into individual device chips by a dicing apparatus, a laser processing apparatus, or the like. Each of the divided device chips is used in an electric apparatus such as a mobile telephone, a personal computer, or the like.

In addition, because a single crystal SiC substrate is expensive, a technology has been proposed which grows a high-resistance polycrystalline SiC substrate by epitaxial growth on an upper surface of a low-resistance polycrystalline SiC substrate, and thereafter forms a single crystal SiC film by epitaxial growth on an upper surface of the high-resistance polycrystalline SiC substrate (see National Publication of International Patent Application No. 2007-503726, for example).

SUMMARY OF THE INVENTION

However, removing the low-resistance polycrystalline SiC substrate from the high-resistance polycrystalline SiC substrate by grinding the low-resistance polycrystalline SiC substrate takes a considerable time, thus resulting in poor productivity.

It is accordingly an object of the present invention to provide a semiconductor substrate processing method capable of efficiently removing a first semiconductor substrate from a two-layer structure semiconductor substrate in which a second semiconductor substrate is epitaxially grown on an upper surface of the first semiconductor substrate such as a low-resistance polycrystalline SiC substrate or the like.

In accordance with an aspect of the present invention, there is provided a semiconductor substrate processing method including: a peeling layer forming step of forming a peeling layer by irradiating a first semiconductor substrate with a laser beam having a wavelength capable of passing through the first semiconductor substrate while positioning a focal point of the laser beam within the first semiconductor substrate; a second semiconductor substrate forming step of forming a second semiconductor substrate by epitaxial growth on an upper surface of the first semiconductor substrate after performing the peeling layer forming step; a peeling step of peeling off the first semiconductor substrate from the peeling layer; and a grinding step of grinding and removing the first semiconductor substrate after performing the peeling step.

Preferably, the first semiconductor substrate is a low-resistance polycrystalline SiC substrate, and the second semiconductor substrate is a high-resistance polycrystalline SiC substrate.

According to the present invention, most of the first semiconductor substrate can be peeled off with the peeling layer as a starting point before the grinding step by forming the peeling layer at a shallow position from the upper surface of the first semiconductor substrate in the peeling layer forming step. It is thus possible to shorten a time taken for the grinding step and efficiently remove the first semiconductor substrate.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
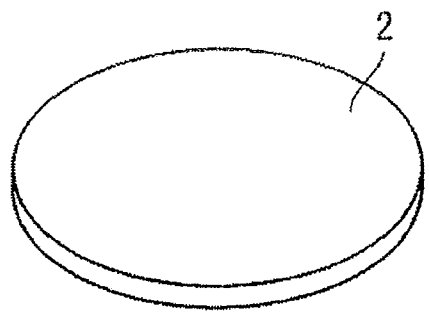
FIG. 1 is a perspective view of a first semiconductor substrate.

A preferred embodiment of a semiconductor substrate processing method according to the present invention will hereinafter be described with reference to the drawings. FIG. 1 depicts a first semiconductor substrate 2 to be processed by the semiconductor substrate processing method according to the present invention. The first semiconductor substrate 2 according to the present embodiment is a low-resistance polycrystalline SiC substrate formed in a shape of a disk having a thickness of substantially 900 µm.

In the present embodiment, a peeling layer forming step is first performed which forms a peeling layer by irradiating the first semiconductor substrate 2 with a laser beam while positioning a focal point of the laser beam having a wavelength capable of passing through the first semiconductor substrate 2 within the first semiconductor substrate 2. The peeling layer forming step can, for example, be performed by using a laser processing apparatus 4 partially depicted in FIG. 2A.

The laser processing apparatus 4 includes: a chuck table (not depicted) that sucks and holds a workpiece; and a condenser 6 that irradiates a workpiece sucked and held on the chuck table with a pulsed laser beam LB. The chuck table is configured to be rotatable about an axis extending in a vertical direction, and is configured to be advanced or retreated freely in each of an X-axis direction indicated by an arrow X in FIG. 2A and a Y-axis direction (direction indicated by an arrow Y in FIG. 2A) orthogonal to the X-axis direction. The condenser 6 includes a condensing lens (not depicted) for condensing the pulsed laser beam LB emitted by a pulsed laser oscillator (not depicted) of the laser processing apparatus 4 and irradiating the workpiece with the condensed pulsed laser beam LB. Incidentally, a plane defined by the X-axis direction and the Y-axis direction is substantially horizontal.

Figure 2A:
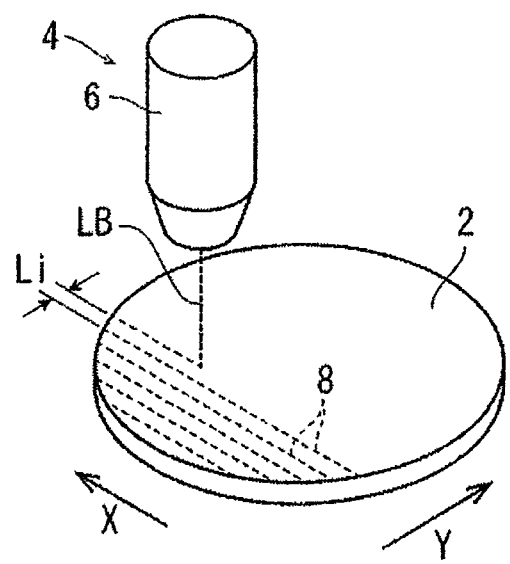
FIG. 2A is a perspective view depicting a state in which a peeling layer forming step is being performed.
Figure 2B:
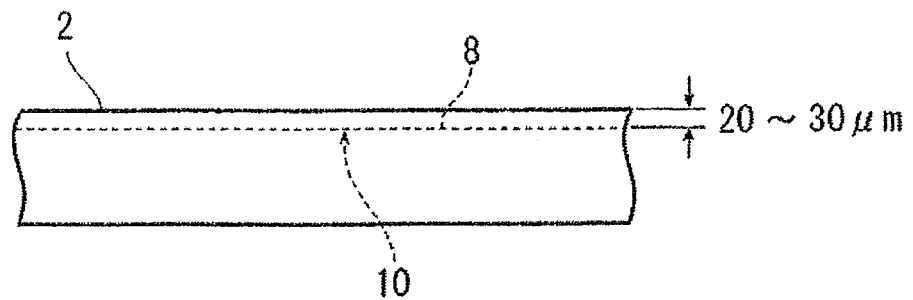
FIG. 2B is a sectional view of the first semiconductor substrate in which a peeling layer is formed.

Continuing the description with reference to FIG. 2A, the peeling layer forming step first sucks and holds the first semiconductor substrate 2 on an upper surface of the chuck table. Next, the condenser 6 is raised or lowered by focal point position adjusting means (not depicted) of the laser processing apparatus 4 to position the focal point within the first semiconductor substrate 2. In the present embodiment, the focal point is positioned at a relatively shallow position (for example, substantially 20 to 30 µm) from the upper surface of the first semiconductor substrate 2. Next, when the pulsed laser beam LB having a wavelength capable of passing through the first semiconductor substrate 2 is applied from the condenser 6 to the first semiconductor substrate 2 while the chuck table is moved in the X-axis direction at a predetermined feed speed, SiC is separated into Si (silicon) and C (carbon) by the application of the pulsed laser beam LB, the pulsed laser beam LB applied next is absorbed by C formed previously and SiC is separated into Si and C in a chained manner, and cracks (not depicted) are formed which extend isotropically from a part where SiC is separated into Si and C. A peeling layer 8 is thus formed. Incidentally, when the first semiconductor substrate 2 is irradiated with the pulsed laser beam LB, the condenser 6 may be moved in place of the chuck table. In addition, the number of times of irradiation of a same part of the first semiconductor substrate 2 with the pulsed laser beam LB (number of paths) can be set arbitrarily.

Then, the application of the pulsed laser beam LB is repeated while the chuck table is index-fed in the Y-axis direction relative to the focal point by a predetermined index amount Li. As a result, a plurality of the peeling layers 8 continuously extending in the X-axis direction are formed at intervals of the predetermined index amount Li in the Y-axis direction, and cracks isotropically extending from the peeling layers 8 are sequentially formed. Consequently, a peeling starting point 10 constituted of the plurality of peeling layers 8 and the cracks and having a decreased strength can be formed at a relatively shallow position from the upper surface of the first semiconductor substrate 2. Incidentally, at the time of the index feeding, the condenser 6 may be moved in place of the chuck table. Such a peeling layer forming step can be performed under the following processing conditions, for example.

Figure 3:
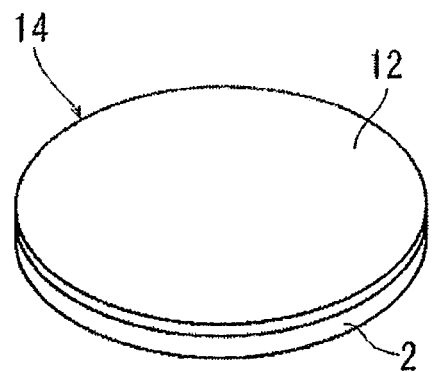
FIG. 3 is a perspective view of a two-layer structure semiconductor substrate in which a second semiconductor substrate is epitaxially grown on an upper surface of the first semiconductor substrate.

Wavelength of the pulsed laser beam: 1064 nm
Repetition frequency: 30 kHz
Average output power: 1.6 W
Feed speed: 234 mm/s
Index amount: 0.125 mm
Number of paths: 25 times After the peeling layer forming step is performed, as depicted in FIG. 3, a second semiconductor substrate forming step is performed which forms a second semiconductor substrate 12 by epitaxial growth on the upper surface of the first semiconductor substrate 2 formed of the low-resistance polycrystalline SiC substrate. The second semiconductor substrate 12 according to the present embodiment is a high-resistance polycrystalline SiC substrate formed with a thickness of substantially 500 µm. Incidentally, a two-layer structure semiconductor substrate including the first semiconductor substrate 2 and the second semiconductor substrate 12 is indicated by reference numeral 14.

Figure 4:
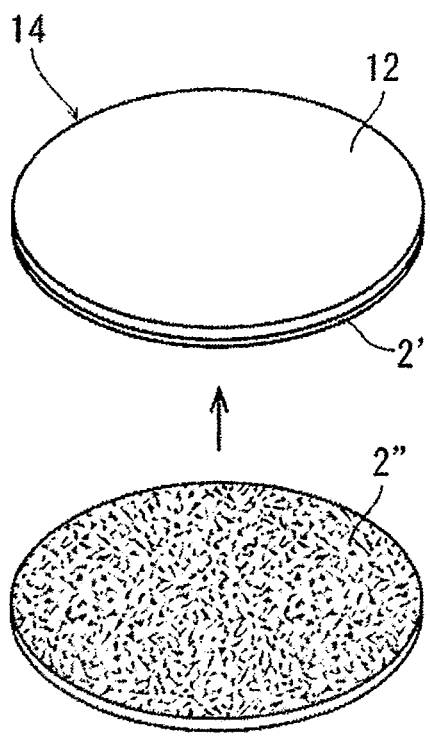
FIG. 4 is a perspective view of the two-layer structure semiconductor substrate after a peeling step is performed.

After the second semiconductor substrate forming step is performed, a peeling step is performed which peels off the first semiconductor substrate 2 from the peeling layer 8. The peeling step can be performed by using a peeling apparatus (not depicted) having an ultrasonic vibrator immersed within a water tank retaining water therein, for example. When the peeling step is performed by using this peeling apparatus, the two-layer structure semiconductor substrate 14 is immersed in the water, and the ultrasonic vibrator is actuated. When the ultrasonic vibrator is actuated, the ultrasonic vibrator and the two-layer structure semiconductor substrate 14 may be brought into contact with each other, or a gap (for example, 2 to 3 mm) may be provided between the ultrasonic vibrator and the two-layer structure semiconductor substrate 14. When the ultrasonic vibrator is actuated, the peeling layer 8 is stimulated and destroyed by an ultrasonic wave from the ultrasonic vibrator. Consequently, as depicted in FIG. 4, most of the first semiconductor substrate 2 can be peeled off from the two-layer structure semiconductor substrate 14 while the peeling layer 8 formed at a relative shallow position from the upper surface of the first semiconductor substrate 2 serves as a starting point. Incidentally, reference numeral 2' denotes the upper surface side of the first semiconductor substrate which slightly remains (for example, with a thickness of substantially 20 to 30 µm) on the two-layer structure semiconductor substrate 14, and reference numeral 2" denotes a lower surface side of the first semiconductor substrate which is peeled off from the two-layer structure semiconductor substrate 14. The peeling step can also be performed by applying an impact to the peeling layer 8 by using a member such as a chisel or the like whose thickness is decreased toward a tip end.

After the peeling step is performed, a grinding step is performed which grinds and removes the first semiconductor substrate 2'. The grinding step can be performed by using a grinding apparatus 16 partially depicted in FIG. 5A and FIG. 5B, for example. The grinding apparatus 16 includes a chuck table 18 that sucks and holds the workpiece and grinding means 20 for grinding the workpiece sucked and held on the chuck table 18.

Figure 5A:
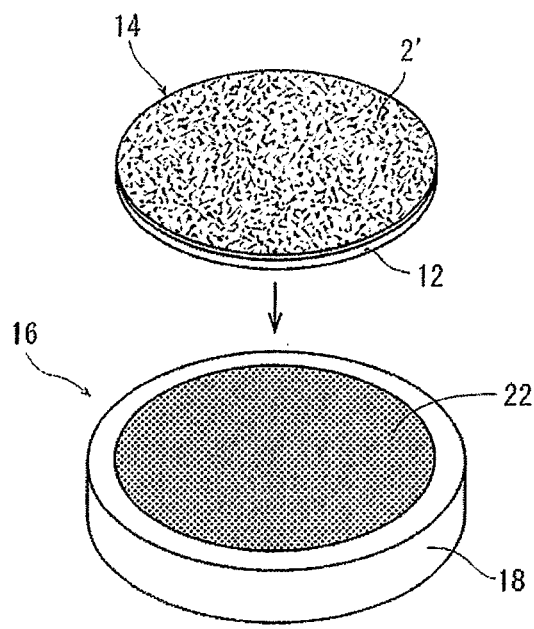
FIG. 5A is a perspective view depicting a state of mounting the two-layer structure semiconductor substrate on a chuck table of a grinding apparatus.

As depicted in FIG. 5A, a porous circular suction chuck 22 connected to suction means (not depicted) is disposed in an upper end part of the chuck table 18. The chuck table 18 sucks and holds the workpiece placed on an upper surface thereof by forming a suction force in the upper surface of the suction chuck 22 by the suction means. In addition, the chuck table 18 is configured to be rotatable about an axis extending in the vertical direction.

The grinding means 20 includes a spindle 24 coupled to a motor (not depicted) for the spindle and extending in the vertical direction and a disk-shaped wheel mount 26 fixed to a lower end of the spindle 24. An annular grinding wheel 30 is fixed to a lower surface of the wheel mount 26 by bolts 28. A plurality of grinding stones 32 annularly arranged at intervals in a circumferential direction are fixed to an outer circumferential edge portion of a lower surface of the grinding wheel 30.

Figure 5B:
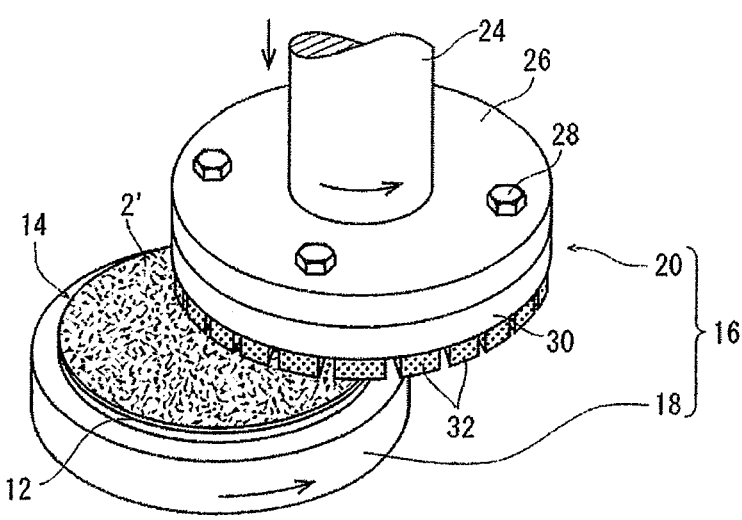
FIG. 5B is a perspective view depicting a state in which a grinding step is being performed.
Figure 5C:
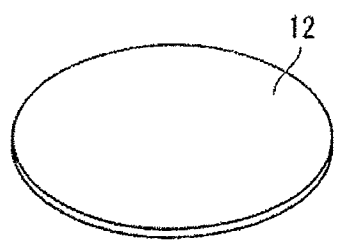
FIG. 5C is a perspective view of the second semiconductor substrate.

Continuing the description with reference to FIG. 5A and FIG. 5B, in the grinding step, the two-layer structure semiconductor substrate 14 is first sucked and held on the upper surface of the chuck table 18 with the first semiconductor substrate 2' oriented upward. Next, the chuck table 18 is rotated counterclockwise as viewed from above at a predetermined rotational speed (for example, 300 rpm). In addition, the spindle 24 is rotated counterclockwise as viewed from above at a predetermined rotational speed (for example, 6000 rpm). Next, raising and lowering means (not depicted) of the grinding apparatus 16 lowers the spindle 24 to bring the grinding stones 32 into contact with the first semiconductor substrate 2'. Thereafter, the spindle 24 is lowered at a predetermined grinding feed speed (for example 1.0 μm/s). Consequently, as depicted in FIG. 5C, the first semiconductor substrate 2' can be ground and removed. Incidentally, in the grinding step, it suffices to be able to flatten a peeling surface of the first semiconductor substrate 2' and remove most of the first semiconductor substrate 2', and the first semiconductor substrate 2' may slightly remain on the two-layer structure semiconductor substrate 14.

As described above, in the present embodiment, the peeling layer 8 is formed at a relatively shallow position from the upper surface of the first semiconductor substrate 2 in the peeling layer forming step, so that most of the first semiconductor substrate 2 can be peeled off with the peeling layer 8 as a starting point before the grinding step. Thus, even when the first semiconductor substrate 2 is formed of a relatively hard material (a material that takes a time to grind) such as a low-resistance polycrystalline SiC, a time taken for the grinding step can be shortened, and the first semiconductor substrate 2 can be removed from the two-layer structure semiconductor substrate 14 efficiently. Hence, the present embodiment can improve productivity.

In the present embodiment, description has been made of an example in which the first semiconductor substrate 2 is formed of a low-resistance polycrystalline SiC and the second semiconductor substrate 12 is formed of a high-resistance polycrystalline SiC. However, the first semiconductor substrate 2 and the second semiconductor substrate 12 may be formed of materials other than the above.

The lower surface side of the first semiconductor substrate 2" which is peeled off from the two-layer structure semiconductor substrate 14 can be reused as a substrate for performing the above-described semiconductor substrate processing method or the like by grinding and flattening the peeling surface of the first semiconductor substrate 2" by using the above-described grinding apparatus 16 or the like.

Incidentally, effects similar to those of the foregoing embodiment can be obtained when the peeling layer is formed by irradiating the first semiconductor substrate with a laser beam while the focal point of the laser beam is positioned in the vicinity of the second semiconductor substrate from the lower surface of the first semiconductor substrate after the second semiconductor substrate is formed on the upper surface of the first semiconductor substrate. However, when the first semiconductor substrate has a large thickness of substantially 1 mm, the laser beam is absorbed on the near side of the focal point within the first semiconductor substrate, and cannot reach the vicinity of the second semiconductor substrate. It is therefore difficult to produce effects similar to those of the foregoing embodiment.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A semiconductor substrate processing method comprising:
a peeling layer forming step of forming a peeling layer at a designated depth within a first semiconductor substrate by irradiating the first semiconductor substrate with a laser beam having a wavelength capable of passing through the first semiconductor substrate while positioning a focal point of the laser beam within the first semiconductor substrate;
a second semiconductor substrate forming step of forming a second semiconductor substrate by epitaxial growth on an upper surface of the first semiconductor substrate after performing the peeling layer forming step thereby forming a two-layer structure semiconductor substrate;
a peeling step of peeling off the first semiconductor substrate from the peeling layer; and
a grinding step of grinding and removing the first semiconductor substrate from the two-layer structure semiconductor substrate after performing the peeling step.

2. The semiconductor substrate processing method according to claim 1, wherein the first semiconductor substrate is a low-resistance polycrystalline SiC substrate, and the second semiconductor substrate is a high-resistance polycrystalline SiC substrate.

3. The semiconductor substrate processing method according to claim 1, wherein the peeling layer forming step includes forming a plurality of peeling layers by repeatedly irradiating the first semiconductor substrate, wherein the plurality of peeling layers continuously extend in an X-axis direction at intervals of a predetermined index amount in a Y-axis direction.

4. The semiconductor substrate processing method according to claim 1, wherein the peeling step includes immersing the two-layer structure semiconductor substrate in water and actuating an ultrasonic vibrator.

5. The semiconductor substrate processing method according to claim 1, wherein the peeling step includes applying an impact to the peeling layer.

6. A semiconductor substrate processing method comprising:
a peeling layer forming step of forming a peeling layer by irradiating a first semiconductor substrate with a laser beam having a wavelength capable of passing through the first semiconductor substrate while positioning a focal point of the laser beam within the first semiconductor substrate;
a second semiconductor substrate forming step of forming a second semiconductor substrate by epitaxial growth directly on the first semiconductor substrate after performing the peeling layer forming step thereby forming a two-layer structure semiconductor substrate;
a peeling step of peeling off the first semiconductor substrate from the peeling layer; and
a grinding step of grinding and removing the first semiconductor substrate from the two-layer structure semiconductor substrate after performing the peeling step.

7. The semiconductor substrate processing method according to claim 6, wherein the first semiconductor substrate is a low-resistance polycrystalline SiC substrate, and the second semiconductor substrate is a high-resistance polycrystalline SiC substrate.

8. The semiconductor substrate processing method according to claim 6, wherein the peeling layer forming step includes forming a plurality of peeling layers by repeatedly irradiating the first semiconductor substrate, wherein the plurality of peeling layers continuously extend in an X-axis direction at intervals of a predetermined index amount in a Y-axis direction.

9. The semiconductor substrate processing method according to claim 6, wherein the peeling step includes immersing the two-layer structure semiconductor substrate in water and actuating an ultrasonic vibrator.

10. The semiconductor substrate processing method according to claim 6, wherein the peeling step includes applying an impact to the peeling layer.

* * * * *